(12) United States Patent
Tetelbaum et al.

(10) Patent No.: US 6,449,760 B1
(45) Date of Patent: Sep. 10, 2002

(54) PIN PLACEMENT METHOD FOR INTEGRATED CIRCUITS

(75) Inventors: Alexander Tetelbaum, Hayward, CA (US); Charutosh Dixit, Sunnyvale, CA (US); Soon-lin Yeap, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 77 days.

(21) Appl. No.: 09/727,426

(22) Filed: Nov. 30, 2000

(51) Int. Cl.[7] .................................................. G06F 9/45
(52) U.S. Cl. ................................. 716/10; 716/8; 716/9
(58) Field of Search ....................................... 716/1–10

(56) References Cited

U.S. PATENT DOCUMENTS

| | | | | |
|---|---|---|---|---|
| 3,968,478 A | * | 7/1976 | Mensch, Jr. ................ 710/305 |
| 3,987,418 A | * | 10/1976 | Buchanan .................... 716/19 |
| 5,343,083 A | * | 8/1994 | Fuse .......................... 327/404 |
| 5,633,806 A | * | 5/1997 | Yusa et al. .................... 716/16 |
| 5,646,422 A | * | 7/1997 | Hashizume .................. 257/48 |
| 6,145,117 A | * | 10/2000 | Eng ............................ 716/18 |
| 6,298,468 B1 | * | 10/2001 | Zhen ........................... 716/2 |

OTHER PUBLICATIONS

HD64180 8–Bit Microprocessor Hardware Manual (HD64180r, HD64180Z), Feb. 1988, Hitachi, pp. 6–9.*
Communications Device Data, Semiconductor Technical Data, 1993, Motorola, pp. 2–48.*

* cited by examiner

Primary Examiner—Vuthe Siek
Assistant Examiner—Sun James Lin
(74) Attorney, Agent, or Firm—Fitch, Even, Tabin & Flannery

(57) ABSTRACT

A method of pin placement for an integrated circuit includes the steps of (a) receiving as input a corresponding set of pin constraints for each pin of a hard macro, (b) receiving as input a specification for the hard macro, (c) locating pin slots on each side of the hard macro, (d) finding at least one of a horizontal interval and a vertical interval on a side of the hard macro for each pin of the hard macro, and (e) assigning each pin of the hard macro to a pin slot within the horizontal interval and the vertical interval that satisfies the corresponding set of pin constraints.

4 Claims, 3 Drawing Sheets

PIN PLACEMENT METHOD FOR INTEGRATED CIRCUITS

BACKGROUND OF THE INVENTION

The present invention relates generally to design tools for integrated circuits. More specifically, but without limitation thereto, the present invention relates to a method of pin placement for hard macros.

Integrated circuits typically include building block circuits called hard macros or "hardmacs". Previous methods of defining pin placement for hard macros in the design of an integrated circuit do not consider all possible constraints on pin placement, disadvantageously resulting in a less than optimum pin placement. Pin constraints are created by a floorplanning tool or a circuit designer to ensure timing closure and efficient interface to the top-level block where the hard macro is instantiated. Also, the pin constraints impact the placement of cells inside the hard macro. For example, a pin constraint may place a pin on a certain side of the hard macro (side constraint), on a selected layer (layer constraint), in a given row (row constraint) or column (column constraint) defining the hard macro area, in a given position, or in a specific sequence.

SUMMARY OF THE INVENTION

The present invention advantageously addresses the problems above as well as other problems by providing a method of pin placement for hard macros that recognizes all pin constraints and satisfies a maximum number thereof.

In one embodiment, the present invention may be characterized as a method of pin placement for an integrated circuit that includes the steps of (a) receiving as input a corresponding set of pin constraints for each pin of a hard macro, (b) receiving as input a specification for the hard macro, (c) creating pin slots on each side of the hard macro, (d) finding at least one of a horizontal interval and a vertical interval on a side of the hard macro for each pin of the hard macro, and (e) assigning each pin of the hard macro to a pin slot within the at least one of a horizontal interval and a vertical interval that satisfies the corresponding set of pin constraints.

In another embodiment, the present invention may be characterized as a computer program product that includes a medium for embodying a computer program for input to a computer and a computer program embodied in the medium for causing the computer to perform the following functions: (a) receiving as input a corresponding set of pin constraints for each pin of a hard macro, (b) receiving as input a specification for the hard macro, (c) creating pin slots on each side of the hard macro, (d) finding at least one of a horizontal interval and a vertical interval on a side of the hard macro for each pin of the hard macro, and (e) assigning each pin of the hard macro to a pin slot within the horizontal interval or the vertical interval that satisfies the corresponding set of pin constraints.

BRIEF DESCRIPTION OF THE DRAWINGS

The above and other aspects, features and advantages of the present invention will be more apparent from the following more specific description thereof, presented in conjunction with the following drawings wherein.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

Any combination (or none) of non-conflicting constraints such as horizontal position, vertical position, side, row, and column constraints may be specified in a pin definition file using a convenient syntax by a user or as the output of the TERA system, a floorplanning design tool that determines hard macro placement inside the top-level block and creates pin and cell constraints for the hard macro. For example, if a horizontal position pin constraint is specified, then either the top or bottom side is also specified to indicate on which side the pin is to be placed. If a vertical position pin constraint is specified, then either the left or right side is also specified to indicate on which side the pin is to be placed. Horizontal and vertical position constraints may be conveniently specified as positive integers assigned to pin positions, i.e., if 100 pins are to be placed on the top side of the hard macro, then "2" corresponds to position 2 among pin positions (1, 2, 3, ..., 100). Offsets from the horizontal and vertical positions, if specified, are ignored, because offsets are specified in physical units, while symbolic units are used to determine relative placement of pins and cells. Pins having top or bottom side constraints may only be constrained to odd layers such as one, three, or five, because wires in odd-numbered layers generally run vertically, while wires in even-numbered layers generally run horizontally. Likewise, pins having left and right side constraints may only be constrained to even layers such as two and four. If a pin is not constrained, then its placement is determined by placement of the data path or net and the control cells that are connected to the pin.

Figure 1:
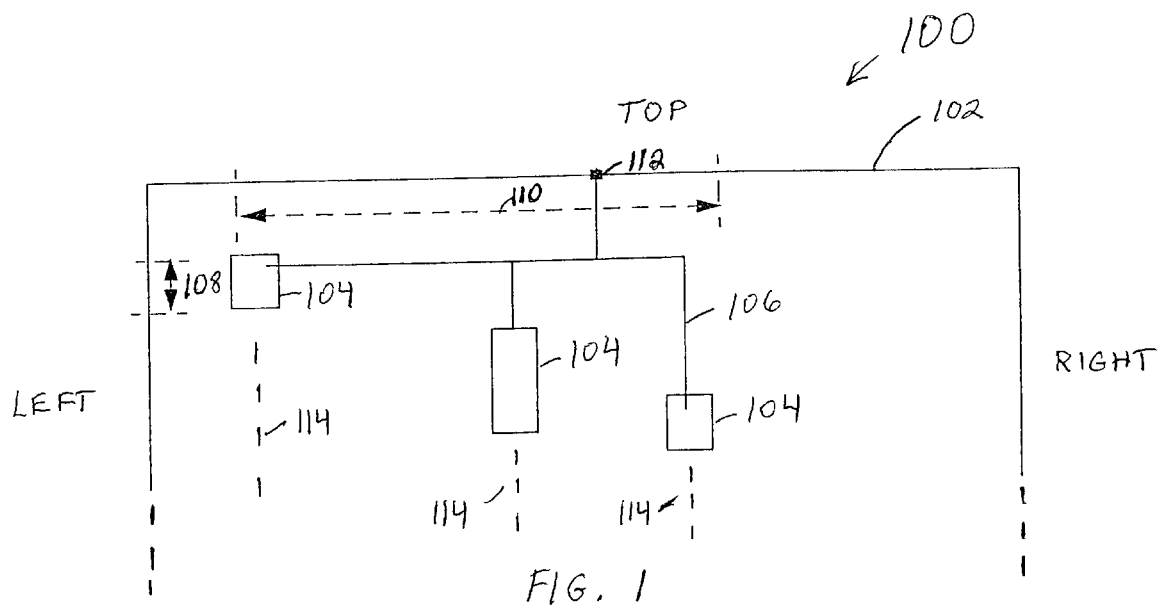
FIG. 1 is a diagram of a pin placement method on a hard macro according to an embodiment of the present invention.

FIG. 1 is a diagram 100 of a pin placement for an unconstrained pin on a hard macro. Shown in FIG. 1 are a hard macro boundary 102, hard macro cells 104, a net 106, a vertical interval 108, a horizontal interval 110, a pin 112, and placement columns 114. The hard macro boundary 102, the hard macro cells 104, and the net 106 are included in a hard macro specification that may be generated according to well known techniques. The vertical interval 108 and the horizontal interval 110 are selected so that if the pin 112 is placed at any point within either the vertical interval 108 and the horizontal interval 110, then the net 106 connecting the pin 112 to the cells 104 has minimal length.

Unconstrained pins are usually connected to control signals and are located on the left or right side of a datapath hard macro, which have a special structure in which data paths run vertically and control signals run horizontally.

A layer constraint specifies a metal layer of the hard macro to which the pin is to be assigned. If a layer constraint is specified for a bus connected to many pins, then that layer constraint is propagated to every pin connected to the bus that does not already have a pin constraint that override the layer constraint. For example, a left side constraint would override a layer 1 constraint because a left side constraint requires a horizontal wire, which generally is only available in an even-numbered layer. If no layer constraint is specified for a bus connected to many pins, individual bus pins may be constrained to different layers. If there are no layer constraints for a pin, then a layer is assigned to the pin by assigning the pin to a pin slot.

Figure 2:
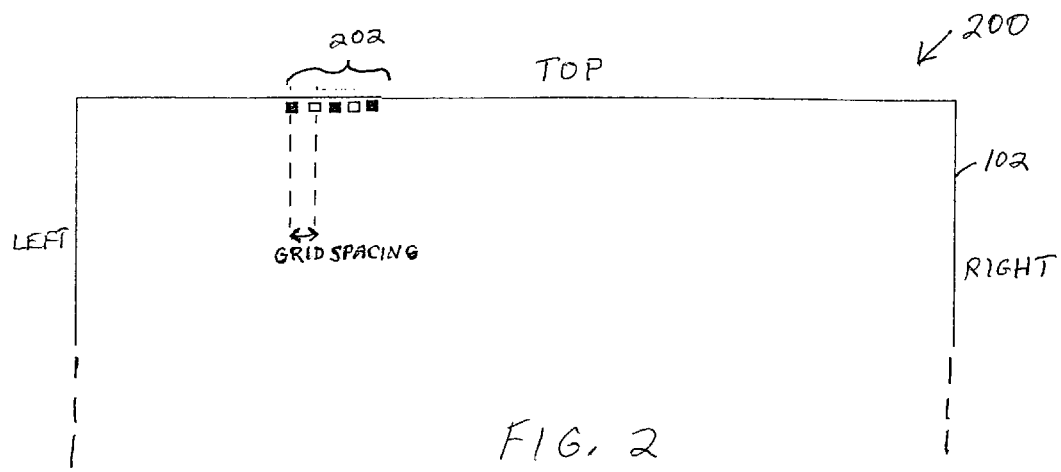
FIG. 2 is a diagram of pin slots illustrating a layer assignment for the pin placement method of FIG. 1.

FIG. 2 is a diagram 200 of pin slots illustrating a layer assignment for the pin placement method of FIG. 1. Shown in FIG. 2 are the hard macro boundary 102 and pin slots 202. Each pin slot is located, for example, on a spacing of one grid unit defined in the hard macro specification. Layers are then assigned to the pin slots 202 in an alternating sequence. For example, along the top and bottom sides metal layer 1 may be assigned to one pin slot, metal layer 3 may be assigned to the next pin slot, metal layer 1 may be assigned to the next pin slot, metal layer 3 may be assigned to the next pin slot, etc. Along the left and right sides, metal layer 2 may be assigned to one pin slot, metal layer 4 may be assigned to the next pin slot, metal layer 2 may be assigned to the next pin slot, metal layer 4 may be assigned to the next pin slot, and so on. Current hard macro designs do not generally use layer 5, however, a set of pin slots in layer 5 may be created. The x-y coordinates of pin slots in layer 5 may coincide with the x-y coordinates in layers 1 and 3, but in 3D space, the z-coordinates will differ for each layer.

Each pin of the hard macro is assigned to one of the pin slots 202. If a layer constraint is specified for the pin, the pin may be assigned to a pin slot 202 having the same layer assignment as the layer constraint. A pin for which no layer constraint is specified may be assigned to any pin slot.

If there is not enough space on a side of the hard macro to place all the pins assigned to the side, then the side is increased accordingly. Typically, all the space on a side is available for pin placement. This includes the space between placement columns 114 in FIG. 1, unless that space has been reserved for other applications, such as clock, signal, or power. For example, if there is insufficient space for pin placement on the top side of the hard macro, then additional pin slots are created at the right end of the hard macro boundary 102 to accommodate all unplaced pins that are not column constrained. If a pin is column constrained and cannot be placed in the column to which the pin is constrained, then the pin is placed in the adjacent space to the right of the column. If the column pin capacity is exceeded, an additional pin slot is created between columns to accommodate the pin. Because the pin slot positions are only relative (not physical), no changes need be made to the pin slots that were assigned before the additional pin slots are inserted.

Figure 3:
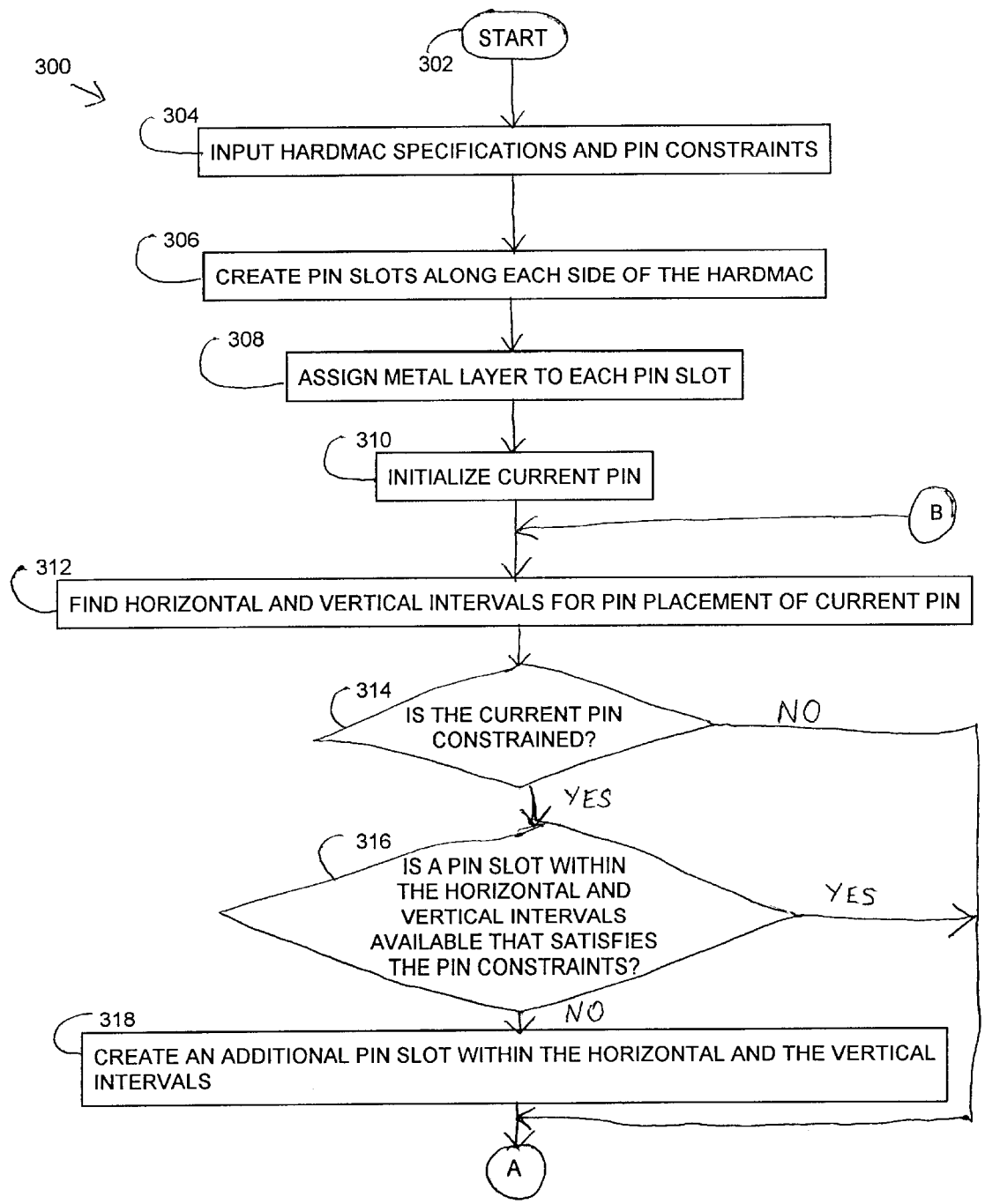
FIG. 3 is a flowchart of the method for pin placement illustrated in FIG. 1 and FIG. 2.
Figure 3:
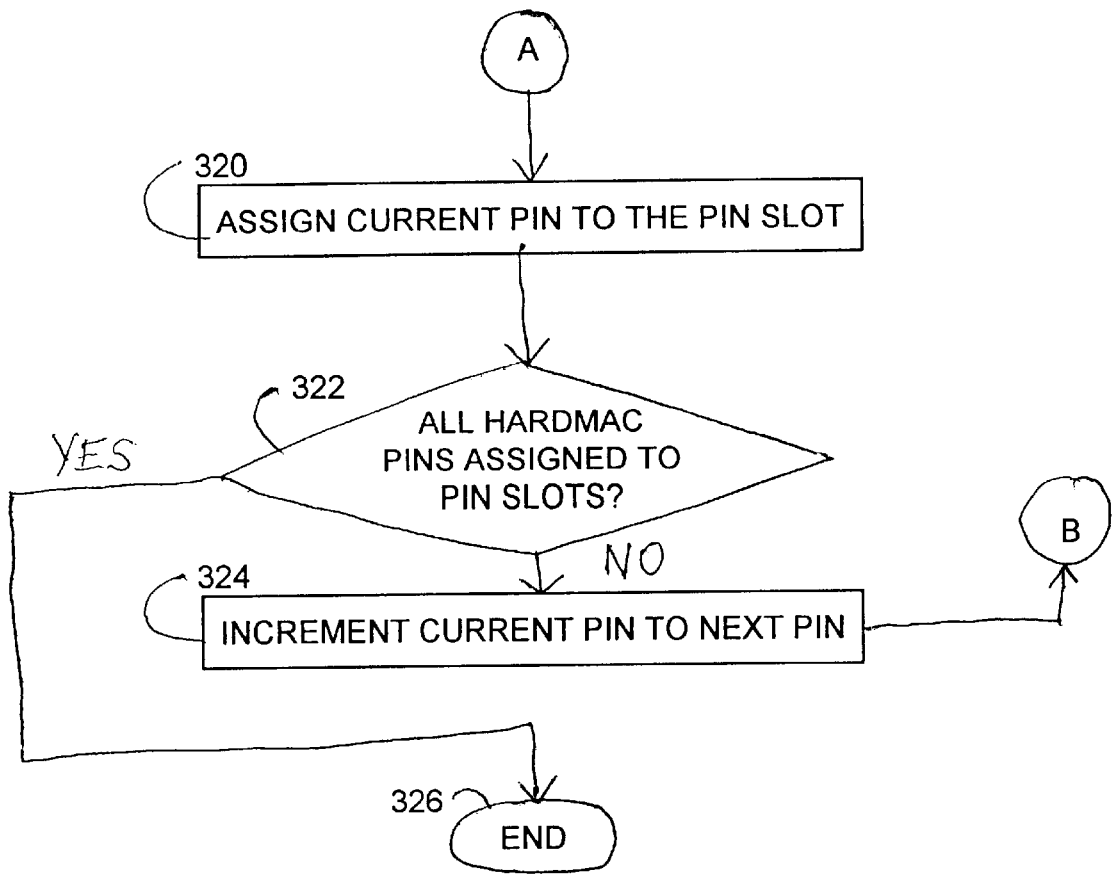

FIG. 3 is a flowchart 300 of the method for pin placement illustrated in FIG. 1 and FIG. 2 that may be used to implement a computer program. Step 302 is the entry point for the flow chart 300. Step 304 receives as inputs the hard macro specifications described above for pin placement and the pin constraints. Step 306 defines pin slots along each side of the hard macro. Step 308 assigns a metal layer to each pin slot. Step 310 initializes a current pin to the first pin of the hard macro. Step 312 finds a horizontal interval and a vertical interval for pin placement in which the net connecting the current pin and associated cells has minimal length. Step 314 checks whether the current pin is constrained to a horizontal position, a vertical position, a side, a row, a column, or a metal layer. If yes, step 316 checks whether a pin slot within the vertical interval and the horizontal interval that satisfies the pin constraints is available. If not, Step 318 creates an additional pin slot within the vertical interval and the horizontal interval. Step 320 assigns the current pin to the pin slot. Step 322 checks whether all the pins of the hard macro have been assigned to pin slots. If not, Step 324 increments the current pin to the next pin and transfers control back to step 312. If all the pins of the hard macro have been assigned, then step 326 exits the flowchart 300.

By the method described above, the optimum pin placement for each pin of a hard macro may be found that minimizes net length and recognizes all pin constraints.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of pin placement for an integrated circuit comprising the steps of:

(a) receiving as input a corresponding set of pin constraints for each pin of a hard macro;

(b) receiving as input a specification for the hard macro;

(c) creating pin slots on each side of the hard macro;

(d) finding at least one of a horizontal interval and a vertical interval on a side of the hard macro for each pin of the hard macro; and (e) assigning each pin of the hard macro to a pin slot within the horizontal interval and the vertical interval that satisfies the corresponding set of pin constraints, wherein step (c) comprises assigning a metal layer to each of the pin slots in an alternating sequence.

2. A method of pin placement for an integrated circuit comprising the steps of:

(a) receiving as input a corresponding set of pin constraints for each pin of a hard macro;

(b) receiving as input a specification for the hard macro;

(c) creating pin slots on each side of the hard macro;

(d) finding at least one of a horizontal interval and a vertical interval on a side of the hard macro for each pin of the hard macro; and (e) assigning each pin of the hard macro to a pin slot within the horizontal interval and the vertical interval that satisfies the corresponding set of pin constraints, wherein step (e) includes creating an additional pin slot within the horizontal interval or the vertical interval if no pin slot therein is available.

3. A computer program product comprising:

a medium for embodying a computer program for input to a computer; and a computer program embodied in the medium for causing the computer to perform the following functions:

(a) receiving as input a corresponding set of pin constraints for each pin of a hard macro;

(b) receiving as input a specification for the hard macro;

(c) creating pin slots on each side of the hard macro;

(d) finding at least one of a horizontal interval and a vertical interval on a side of the hard macro for each pin of the hard macro; and (e) assigning each pin of the hard macro to a pin slot within the horizontal interval and the vertical interval that satisfies the corresponding set of pin constraints, wherein function (e) comprises assigning a metal layer to each of the pin slots in an alternating sequence.

4. A computer program product comprising:

a medium for embodying a computer program for input to a computer; and a computer program embodied in the medium for causing the computer to perform the following functions:

(a) receiving as input a corresponding set of pin constraints for each pin of a hard macro;
(b) receiving as input a specification for the hard macro;
(c) creating pin slots on each side of the hard macro;
(d) finding at least one of a horizontal interval and a vertical interval on a side of the hard macro for each pin of the hard macro; and
(e) assigning each pin of the hard macro to a pin slot within the horizontal interval and the vertical interval that satisfies the corresponding set of pin constraints, wherein function (e) includes creating an additional pin slot within the horizontal interval or the vertical interval if no pin slot therein is available.

* * * * *